United States Patent [19]
Mitchell et al.

[11] 3,956,647
[45] May 11, 1976

[54] ACOUSTIC SURFACE-WAVE DEVICES USING MONO CRYSTALLINE BISMUTH SILICON OXIDE SUBSTRATE

[75] Inventors: Richard Frank Mitchell, Kingston; Eileen Read, High Wycombe; Richard Stevens, Copthorne, all of England

[73] Assignee: U.S. Philips Corporation, New York, N.Y.

[22] Filed: Oct. 15, 1974

[21] Appl. No.: 514,472

[30] Foreign Application Priority Data
Oct. 12, 1973 United Kingdom............... 47745/73

[52] U.S. Cl.................................. 310/9.5; 310/9.6; 310/9.8; 310/8.1; 333/30 R
[51] Int. Cl.²......................................... H01L 41/04
[58] Field of Search .............. 310/9.5, 9.6, 9.7, 9.8, 310/8.1, 8; 333/30 R, 72

[56] References Cited
UNITED STATES PATENTS

| 3,845,418 | 10/1974 | Weglein............................ 310/9.8 X |
| 3,845,420 | 2/1973 | Holland et al................... 310/9.8 X |
| 3,846,722 | 11/1974 | de Klerk........................... 310/9.8 X |
| 3,866,153 | 2/1975 | Slobodnik....................... 310/9.5 X |

*Primary Examiner*—Mark O. Budd
*Attorney, Agent, or Firm*—Frank R. Trifari; Bernard Franzblau

[57] ABSTRACT

An acoustic surface wave filter comprising a monocrystalline wafer of bismuth silicon oxide having a special orientation of the ASW propagation surface and the interdigital transducers relative to the crystal plane whereby pick-up of undesired bulk waves is reduced.

5 Claims, 4 Drawing Figures

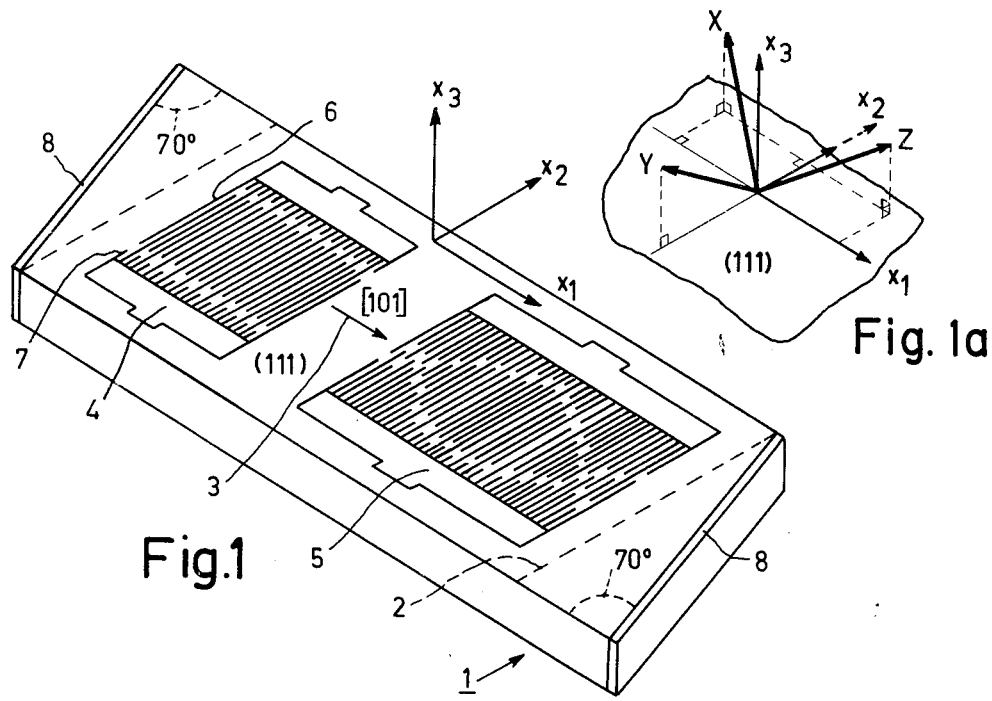
Fig. 1
Fig. 1a
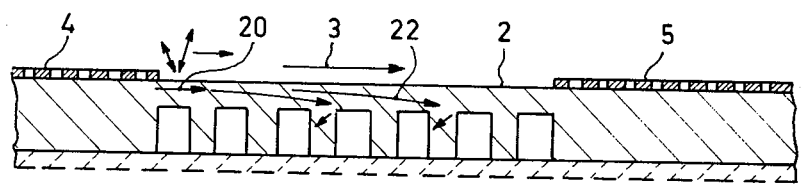
Fig. 2
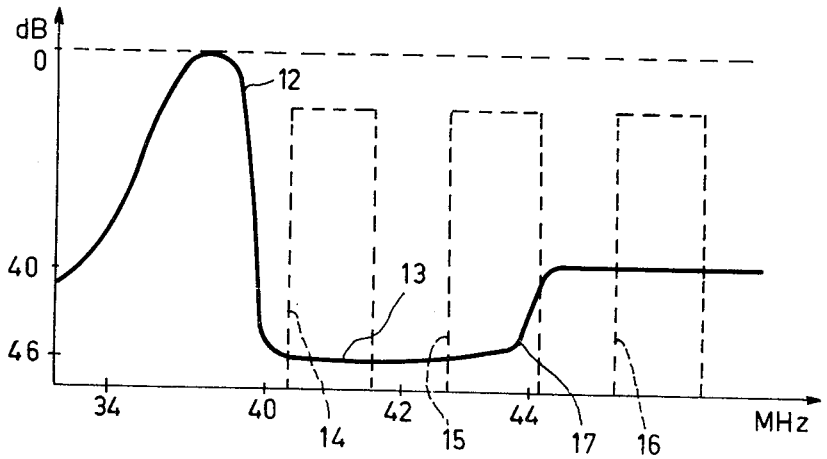
Fig. 3

ACOUSTIC SURFACE-WAVE DEVICES USING MONO CRYSTALLINE BISMUTH SILICON OXIDE SUBSTRATE

The invention relates to improvements in or relating to electromechanical band-pass filters and/or delay devices employing acoustic surface waves of the kind in which the wave amplitude decreases rapidly with the distance from the propagation surface, such as for example Rayleigh waves or generalised Rayleigh waves, especially but not exclusively for intermediate frequency filtering for television broadcast receivers.

The use of acoustic surface waves has enabled frequency-selective filters and/or delay devices to be manufactured in a form which is small and robust, using techniques which are similar to, and compatible with, integrated circuit manufacture. Such devices makes it possible to avoid certain difficulties, such as the bulk and manufacturing cost, associated with the provision of discrete inductors.

In such a device, an acoustic surface wave is launched on a planar acoustic surface-wave propagation surface of a piezoelectric body by means of an interdigital electrode array which forms a launching transducer. A further interdigital electrode array is arranged in the path of acoustic surface waves propagating from the launching transducer and forms a receiving transducer which converts the received acoustic surface wave back into a corresponding electrical signal. The interdigital arrays each have a periodic structure which, in conjunction with the acoustic surface-wave propagation velocity, give rise to a frequency-selective overall response for the device. This response can be tailored by suitably arranging the spacing, width and amount of overlap of adjacent electrode elements in the array to provide any of a large variety of desired band-pass responses.

However, the electrical field distribution in an interdigital electrode array also may produce, in addition to the desired acoustic surface wave, undesired bulk waves in longitudinal and shear modes which propagate through the body at velocities which differ in general from that of the acoustic surface wave and can be received by the receiving transducer to give rise to a corresponding undesired output signal. In the design of an intermediate frequency filter for use in a television broadcast receiver, very stringent standards of signal rejection are demanded for frequencies adjacent and just above the pass-band and it is in and near this region that corresponding bulk waves tend to be excited by the interdigital transducers at frequencies which depend on the propagation velocity of the bulk wave concerned.

Bulk waves can be emitted by an interdigital transducer at varying angles to the surface-wave propagation surface and those directed towards the opposite surface of the wafer can be absorbed and/or scattered by suitable means. It has been found, however, that even when this has been carried out effectively, a significant unpredictable undesired component can still occur in the filter output.

It is an object of the invention to provide an acoustic surface-wave device which is relatively cheap and compact and in which the aforementioned undesirable signal component can be reduced to an acceptably small magnitude. According to the invention there is provided an acoustic surface-wave device comprising a body in the form of a wafer of monocrystalline bismuth silicon oxide formed so that a major surface of said wafer, which constitutes the acoustic surface-wave propagation surface of the device, lies substantially parallel to the crystallographic (111) plane or a crystallographically-equivalent plane, as herein defined. The respective launching and receiving interdigital transducers are applied to said major surface respectively to launch and to receive acoustic surface waves in any one of the directions $[\bar{1}\ 0\ 1]$, $[1\ \bar{1}\ 0]$ and $[0\ 1\ \bar{1}]$ or equivalent directions as herein defined in said (111) plane or in any one of the crystallographically-equivalent directions, as herein defined, in said equivalent plane. The wafer is arranged so that bulk waves directed at the other major surface thereof are effectively absorbed and/or scattered and said transducers are so spaced apart that bulk shear waves having a particle motion inclined to said firstmentioned major surface and launched by one of said transducers in the direction of said other transducer is substantially prevented from reaching said other transducer.

Bismuth silicon oxide ($Bi_{12}SiO_{20}$) is a symmetrical cubic crystal and as a consequence of this the X, Y, Z, -X, -Y and -Z crystallographic directions can all be regarded as equivalent to one another with respect to the piezoelectric coefficients. Thus the (111) plane is equivalent to the $(\bar{1}\ \bar{1}\ \bar{1})$ plane and the $[\bar{1}\ 0\ 1]$, $[1\ \bar{1}\ 0]$ and $[0\ 1\ \bar{1}]$ directions are respectively equivalent to the opposite $[1\ 0\ \bar{1}]$, $[\bar{1}\ 1\ 0]$ and the $[0\ \bar{1}\ 1]$ directions.

The following are also to be taken herein as crystallographically-equivalent to these planes and directions respectively:

The directions $[1\ \bar{1}\ 0]$, $[0\ 1\ 1]$ and $[1\ 0\ 1]$ or $[\bar{1}\ 1\ 0]$, $[0\ \bar{1}\ \bar{1}]$ and $[\bar{1}\ 0\ \bar{1}]$ in the plane $(1\ 1\ \bar{1})$ or $(\bar{1}\ \bar{1}\ 1)$, the directions $[0\ 1\ \bar{1}]$, $[1\ 0\ 1]$ and $[1\ 1\ 0]$ or $[0\ \bar{1}\ 1]$, $[\bar{1}\ 0\ \bar{1}]$ and $[\bar{1}\ \bar{1}\ 0]$ in the plane $(\bar{1}\ 1\ 1)$ or $(1\ \bar{1}\ \bar{1})$, or the directions $[1\ 1\ 0]$, $[\bar{1}\ 0\ 1]$ and $[0\ 1\ 1]$ or $[\bar{1}\ \bar{1}\ 0]$, $[1\ 0\ \bar{1}]$ and $[0\ \bar{1}\ 1]$ in the plane $(1\ \bar{1}\ 1)$ or $(\bar{1}\ 1\ \bar{1})$.

The choice of a suitable piezoelectric material for the manufacture of acoustic surface-wave devices has in the past proved difficult. Most inherently piezoelectric or polarised monocrystals having a sufficiently high piezoelectric coupling factor ($k^2$), an example of the latter being lithium niobate, are relatively expensive, while polarised artificial ceramics tend to be difficult to manufacture with sufficiently consistent and uniform properties.

Bismuth silicon oxide is a monocrystal which can readily be manufactured from relatively inexpensive materials and has the advantage that the velocity of propagation of acoustic surface waves is considerably lower than that for lithium niobate, thus enabling the equivalent filter to be made of smaller dimensions. Bismuth silicon oxide can also provide a satisfactory piezoelectric coupling factor ($k^2$) of nearly half that of lithium niobate.

The invention stems from the realisation that the residual undesired bulk signals which can remain even when steps have been taken to absorb and/or scatter bulk waves incident on the major surface of the wafer, arise from bulk longitudinal and shear waves which are launched by the launching transducer in a direction parallel to the desired acoustic surface-wave propagation path. By forming the wafer of monocrystalline bismuth silicon oxide so that the acoustic surface-wave propagation surface is substantially parallel to the (111) plane and by directing the acoustic surface wave in either direction along any one of the directions $[\bar{1}\ 0\ 1]$, $[1\ \bar{1}\ 0]$ or $[0\ 1\ \bar{1}]$, it is found that the two bulk shear waves which can propagate mechanically in the crystal in a direction parallel to the surface have transverse particle motions which are directed respectively at angles of 60° and 30° to the propagation surface. Both bulk shear waves are launched by an interdigital transducer. The shear wave with a transverse particle motion inclined at 60° to the surface has the lower velocity of propagation and this in conjunction with the interdigital electrode spacing can provide a spurious response in the stop band just above the pass-band of a band-pass filter. However, since the particle motion is at 60° to the surface, this shear wave component is soon deflected away from the propagation surface to be scattered or absorbed at the other surface of the wafer. The shear wave with a transverse particle motion inclined at 30° to the surface has a higher velocity of propagation and can produce spurious signals further away from the pass-band. This shear wave is deflected away from the propagation surface more gradually but the allowable magnitude of the spurious response is in general also greater.

A longitudinal bulk wave can also be launched in the acoustic surface-wave propagation direction but the velocity of this wave is higher than that of the other two and it therefore gives rise to a response which is spaced still further from the pass-band and can therefore be permitted to be larger in magnitude. In addition to these factors the acoustic surface-wave coupling factor ($k^2$) is relatively large for this orientation and is sufficiently greater than the magnitude of the corresponding piezoelectric constants which couple the transducer field to the respective bulk waves so that the desired acoustic surface-wave signal is enhanced relative to the spurious signal responses, the latter being small enough to permit a satisfactory television intermediate frequency filter to be manufactured, provided that the launching and receiving transducers are spaced sufficiently far apart.

In order that the invention may be clearly understood and readily carried into effect, an embodiment thereof will now be described, by way of example, with reference to the accompanying drawings, of which:

FIG. 1 illustrates, in perspective, an acoustic surface-wave filter embodying the invention, FIG. 1a a is a partial enlarged view of FIG. 1, showing the relationship of the relationship between the major sufaces of the wafer and the crystallographic planes of the monocrystal, FIG. 2 is a longitudinal sectional detail relating to FIG. 1, and FIG. 3 is a graph depicting response versus frequency relating to the filter shown in FIG. 1.

An acoustic surface-wave television intermediate frequency filter for an intermediate frequency of 37 MHz embodying the invention is illustrated in FIG. 1, to which reference will now be made. A wafer 1 is cut from a monocrystal of bismuth silicon oxide ($Bi_{12}SiO_{20}$) so that an acoustic surface-wave propagation surface 2, which comprises one of the major surfaces of the wafer, is oriented parallel to the (111) crystallographic plane of the monocrystal. In order to accomplish this the crystallographic axes of the monocrystal are determined in known manner using X-ray diffraction, and, after slicing, launching and receiving interdigital transducers 4, 5 are formed on the surface 2, conveniently from a layer of gold using for example the techniques of photolithography, so that the acoustic surface-wave propagation direction 3 for an acoustic surface wave launched by the transducer 4 and received by the transducer 5 is directed along the zone axis [$\bar{1}$ 0 1]. In normal production, a matrix pattern of transducer pairs 4, 5 is formed on one slice each with the said orientation and the slice is subsequently divided up into individual wafers.

The form, spacing and weighting of the electrodes 6 of the interdigital transducers 4 and 5 are designed in conventional manner to provide the desired pass-band for the filter. In order to simplify the design procedure, the electrodes of one of the transducers, namely transducer 4, are made of uniform length and width, the weighting being confined to the electrodes of the transducer 5. Dummy electrode portions 7 are introduced to fill the space between adjacent electrode elements connected to the same terminal connection where the interposed electrode element has been shortened in order to maintain the acoustic surface-wave velocity constant across the array and thus avoid undesired distortion of the beam. The ends 8 of the wafer 1 are cut at an angle of approximately 70° to the acoustic surface-wave propagation direction to scatter the unwanted beam radiated by the transducer 4 away from the transducer 5 and by the transducer 5 away from the transducer 4.

The other major surface 10 of the wafer is treated so that bulk wave disturbances directed thereat by the transducers 4 and 5 are effectively absorbed and/or scattered and therefore do not reach the other transducer causing an undesired output. One method of treatment is to form a plurality of discrete recesses in the lower surface 10 which extend to within a few acoustic surface-wave wavelengths of the propagation surface 2 as described and claimed in our co-pending U.S. Pat. Application Ser. No. 501,482, filed Aug. 29, 1974.

Referring to the graph shown in FIG. 3, which depicts the output signal magnitude against frequency for a constant input signal magnitude, the line 12 represents the desired filter pass-band response to be provided by the acoustic surface-wave filter. The region 13 adjacent the pass-band is a relatively deep stop-band which is necessary in order to remove interference from the sound carrier of an adjacent television channel.

The transducer 4 will also launch a bulk shear wave having a particle motion inclined at an angle of 60 degrees to the propagation surface 2 in a direction 20 (shown in FIG. 2) parallel to the acoustic surface-wave propagation direction 3. Since the velocity of this bulk wave is slightly greater than that of the acoustic surface wave, the pass-band 14 (FIG. 3) of this bulk wave will lie just above the desired pass-band of the filter in the required deep stop-band 13. However, the large inclination of the particle motion to the surface 2 means that this shear bulk wave will be relatively rapidly deflected away from the propagation surface 2 as it travels towards the transducer 5, and with the proper spacing of the transducers 4 and 5 this wave is effectively scattered or absorbed.

A bulk shear wave having a particle motion inclined at an angle of 30° to the propagation surface 2 is also launched by the transducer 4 in the direction 20. This bulk shear wave has a higher velocity than the other bulk shear wave so that the pass-band 15 thereof lies further away from the desired pass-band of the acoustic surface-wave filter. Owing to the smaller angle that the particle motion makes with the surface 2, this wave will be deflected more slowly as indicated by the path 22 (FIG. 2) so that the spacing of the transducers must be chosen such that the resultant output from the bulk wave signal 15 lies below the desired attenuation curve 17 at that point.

A longitudinal bulk wave is launched by the transducer 4 in the direction 20 again in a direction parallel to the acoustic surface-wave propagation direction and travels directly to the receiving transducer 5. The velocity of this wave is higher than that of the two shear waves and the pass-band 16 lies well away from the pass-band of the acoustic surface-wave response at a point where the required level of signal rejection is not as great as that nearer the desired pass-band. By employing the orientation described in bismuth silicon oxide the coupling factor ($k^2$) to the acoustic surface wave is made large relative to the piezoelectric coupling factor which causes the interdigital transducer to launch and receive this bulk longitudinal wave, and consequently the response 16 is caused to be less than the desired attenuation response for the filter and is therefore acceptable.

Other equivalent crystallographic orientations and equivalent crystallographic planes as herein defined can equally well be employed. The invention can also be applied with advantage to devices whose function is primarily one of providing a signal delay, since the undesired bulk waves travel at different velocities from that of the acoustic surface wave.

What is claimed is:

1. An acoustic surface-wave device comprising a wafer of monocrystalline bismuth silicon oxide having first and second major surfaces and formed so that the first major surface of said wafer, which constitutes the acoustic surface-wave propagation surface of the device, lies substantially parallel to the crystallographic (111) plane or a crystallographically-equivalent plane, as herein defined, a launching and a receiving interdigital transducer coupled to said first major surface respectively to launch and to receive acoustic surface waves in any one of the directions [1 0 1] [1 1 0] and [0 1 1] or equivalent directions as herein defined in said (111) plane or in any one of the crystallographically-equivalent directions, as herein defined, in said equivalent plane, and means for attenuating bulk waves directed at the second major surface of the wafer, said transducers being spaced apart a distance such that bulk shear waves having a particle motion inclined to said first major surface and launched by one of said transducers in the direction of the other transducer are substantially prevented from reaching said other transducer.

2. An acoustic surface wave device as claimed in claim 1 wherein the spacing, width and overlap of adjacent electrode elements of at least one of said transducers are chosen so that the device provides a band-pass filter response.

3. An acoustic surface wave device as claimed in claim 1 wherein the form, spacing and weighting of the electrodes of one interdigital electrode array of one of said transducers are chosen and the space between the launching and receiving transducers is chosen so that the device provides a frequency filter characteristic of the general form shown in FIG. 3 of the drawing.

4. An acoustic surface wave device as claimed in claim 1 wherein the ends of the wafer transverse to the direction of propagation of the acoustic surface wave make an angle of approximately 70° to said propagation direction.

5. An acoustic surface wave device as claimed in claim 1 wherein said attenuating means comprises a plurality of discrete recesses formed in the second major surface of the wafer and which extend into the wafer to within at most three acoustic surface wave wavelengths of the first major surface.

* * * * *

UNITED STATES PATENT AND TRADEMARK OFFICE
CERTIFICATE OF CORRECTION

PATENT NO. : 3,956,647
DATED : May 11, 1976
INVENTOR(S) : RICHARD FRANK MITCHELL ET AL

It is certified that error appears in the above-identified patent and that said Letters Patent are hereby corrected as shown below:

Claim 1, col. 6, line 2, change "[101] [110]" to -- [$\bar{1}$01] [1$\bar{1}$0] --;

line 3, change "[011]" to -- [01$\bar{1}$] --;

Signed and Sealed this

Fourteenth Day of September 1976

[SEAL]

Attest:

RUTH C. MASON
*Attesting Officer*

C. MARSHALL DANN
*Commissioner of Patents and Trademarks*